(12) United States Patent
Reddy et al.

(10) Patent No.: US 9,320,387 B2
(45) Date of Patent: Apr. 26, 2016

(54) SULFUR DOPED CARBON HARD MASKS

(71) Applicant: Lam Research Corporation, Fremont, CA (US)

(72) Inventors: Sirish K. Reddy, Hillsboro, OR (US); Alice G. Hollister, Tigard, OR (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/270,001

(22) Filed: May 5, 2014

(65) Prior Publication Data

US 2015/0093915 A1    Apr. 2, 2015

Related U.S. Application Data

(60) Provisional application No. 61/884,800, filed on Sep. 30, 2013.

(51) Int. Cl.
*A47J 31/60* (2006.01)
*C11D 11/00* (2006.01)
*C11D 17/04* (2006.01)
*C11D 7/12* (2006.01)
*H01L 21/027* (2006.01)
*C11D 3/39* (2006.01)

(52) U.S. Cl.
CPC .............. *A47J 31/60* (2013.01); *C11D 3/3942* (2013.01); *C11D 7/12* (2013.01); *C11D 11/0041* (2013.01); *C11D 17/041* (2013.01); *C11D 17/046* (2013.01); *H01L 21/0271* (2013.01); *A47J 2203/00* (2013.01)

(58) Field of Classification Search
CPC ............ H01L 21/0332; H01L 21/3146; H01L 21/76877; H01L 21/67115; H01L 21/67248
See application file for complete search history.

(56) References Cited

U.S. PATENT DOCUMENTS

| | | | |
|---|---|---|---|
| 3,816,976 A | 6/1974 | Stork et al. |
| 4,209,357 A | 6/1980 | Gorin et al. |
| 4,274,841 A | 6/1981 | Andersen et al. |
| 4,668,261 A | 5/1987 | Chatzipetros et al. |
| 4,673,589 A | 6/1987 | Standley |
| 4,863,493 A | 9/1989 | Kotani et al. |
| 4,863,760 A | 9/1989 | Schantz et al. |

(Continued)

FOREIGN PATENT DOCUMENTS

| | | |
|---|---|---|
| FR | 2853313 | 10/2004 |
| JP | 62019539 | 1/1987 |

(Continued)

OTHER PUBLICATIONS

U.S. Appl. No. 14/185,757, filed Feb. 20, 2014, entitled PECVD Films for EUV Lithography.

(Continued)

*Primary Examiner* — Kyoung Lee
(74) *Attorney, Agent, or Firm* — Weaver Austin Villeneuve & Sampson LLP

(57) ABSTRACT

Provided are methods of forming ashable hard masks (AHMs) with high etch selectivity and low hydrogen content using plasma enhanced chemical vapor deposition. Methods involve exposing a first layer to be etched on a semiconductor substrate to a carbon source and sulfur source, and generating a plasma to deposit a sulfur-doped AHM or amorphous carbon-based film on the first layer.

17 Claims, 3 Drawing Sheets

(56) References Cited

U.S. PATENT DOCUMENTS

| | | | |
|---|---|---|---|
| 4,975,144 A | 12/1990 | Yamazaki et al. | |
| 5,222,549 A | 6/1993 | Ishii et al. | |
| 5,231,057 A | 7/1993 | Doki et al. | |
| 5,261,250 A | 11/1993 | Missimer | |
| 5,378,316 A | 1/1995 | Franke et al. | |
| 5,470,661 A | 11/1995 | Bailey et al. | |
| 5,562,952 A | 10/1996 | Nakahigashi et al. | |
| 5,670,066 A | 9/1997 | Barnes et al. | |
| 5,792,269 A | 8/1998 | Deacon et al. | |
| 5,900,288 A | 5/1999 | Kuhman et al. | |
| 5,968,379 A * | 10/1999 | Zhao | C23C 16/45565 118/723 I |
| 5,985,103 A | 11/1999 | Givens et al. | |
| 6,006,797 A | 12/1999 | Bulow et al. | |
| 6,030,591 A | 2/2000 | Tom et al. | |
| 6,035,803 A | 3/2000 | Robles et al. | |
| 6,041,734 A | 3/2000 | Raoux et al. | |
| 6,066,209 A | 5/2000 | Sajoto et al. | |
| 6,150,719 A | 11/2000 | Saia et al. | |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,367,413 B1 | 4/2002 | Sill et al. | |
| 6,387,819 B1 | 5/2002 | Yu | |
| 6,422,918 B1 | 7/2002 | Avanzino et al. | |
| 6,458,516 B1 | 10/2002 | Ye et al. | |
| 6,465,051 B1 | 10/2002 | Sahin et al. | |
| 6,478,924 B1 | 11/2002 | Shamouilian et al. | |
| 6,541,397 B1 | 4/2003 | Bencher | |
| 6,573,030 B1 | 6/2003 | Fairbairn et al. | |
| 6,613,434 B1 | 9/2003 | Drevillon et al. | |
| 6,617,553 B2 | 9/2003 | Ho et al. | |
| 6,635,185 B2 | 10/2003 | Demmin | |
| 6,777,349 B2 | 8/2004 | Fu et al. | |
| 6,787,452 B2 | 9/2004 | Sudijono et al. | |
| 6,787,819 B2 | 9/2004 | Rhodes et al. | |
| 6,967,072 B2 | 11/2005 | Latchford et al. | |
| 7,064,078 B2 | 6/2006 | Liu et al. | |
| 7,202,176 B1 | 4/2007 | Goto et al. | |
| 7,205,228 B2 | 4/2007 | Padhi et al. | |
| 7,220,982 B2 | 5/2007 | Campbell | |
| 7,223,526 B2 | 5/2007 | Fairbairn et al. | |
| 7,235,478 B2 | 6/2007 | Geng et al. | |
| 7,271,106 B2 | 9/2007 | Abatchev et al. | |
| 7,288,484 B1 | 10/2007 | Goto et al. | |
| 7,314,506 B2 | 1/2008 | Vininski et al. | |
| 7,323,401 B2 | 1/2008 | Ramaswamy et al. | |
| 7,381,644 B1 | 6/2008 | Subramonium et al. | |
| 7,399,712 B1 | 7/2008 | Graff | |
| 7,495,984 B2 | 2/2009 | Kim et al. | |
| 7,576,009 B2 | 8/2009 | Lee et al. | |
| 7,803,715 B1 | 9/2010 | Haimson et al. | |
| 7,820,556 B2 | 10/2010 | Hsu et al. | |
| 7,915,166 B1 | 3/2011 | Yu et al. | |
| 7,955,990 B2 | 6/2011 | Henri et al. | |
| 7,981,777 B1 | 7/2011 | Subramonium et al. | |
| 7,981,810 B1 | 7/2011 | Subramonium et al. | |
| 8,110,493 B1 | 2/2012 | Subramonium et al. | |
| 8,114,782 B2 | 2/2012 | Graff | |
| 8,129,281 B1 | 3/2012 | Cheung et al. | |
| 8,227,352 B2 | 7/2012 | Yu et al. | |
| 8,309,473 B2 | 11/2012 | Hsu et al. | |
| 8,435,608 B1 | 5/2013 | Subramonium et al. | |
| 8,563,414 B1 | 10/2013 | Fox et al. | |
| 8,569,179 B2 | 10/2013 | Graff | |
| 8,664,124 B2 | 3/2014 | Graff | |
| 8,669,181 B1 | 3/2014 | Yu et al. | |
| 8,962,101 B2 | 2/2015 | Subramonium et al. | |
| 2001/0021491 A1 | 9/2001 | Chen et al. | |
| 2002/0182848 A1 | 12/2002 | Joseph et al. | |
| 2003/0044532 A1 | 3/2003 | Lee et al. | |
| 2003/0106647 A1 | 6/2003 | Koshiishi et al. | |
| 2004/0000534 A1 | 1/2004 | Lipinski | |
| 2004/0016972 A1 | 1/2004 | Singh et al. | |
| 2004/0018750 A1 | 1/2004 | Sophie et al. | |
| 2004/0023502 A1 | 2/2004 | Tzou et al. | |
| 2004/0140506 A1 | 7/2004 | Singh et al. | |
| 2004/0180551 A1 | 9/2004 | Biles et al. | |
| 2004/0224504 A1 | 11/2004 | Gadgil | |
| 2004/0266195 A1 | 12/2004 | Dokumaci et al. | |
| 2005/0042889 A1 | 2/2005 | Lee et al. | |
| 2005/0054202 A1 | 3/2005 | Pan et al. | |
| 2005/0098119 A1 | 5/2005 | Burger et al. | |
| 2005/0112506 A1 | 5/2005 | Czech et al. | |
| 2005/0129935 A1 | 6/2005 | Kunitake et al. | |
| 2005/0130404 A1 | 6/2005 | Moghadam et al. | |
| 2005/0167394 A1 | 8/2005 | Liu et al. | |
| 2005/0202683 A1 | 9/2005 | Wang et al. | |
| 2005/0260411 A1 | 11/2005 | Ravi | |
| 2005/0287771 A1 | 12/2005 | Seamons et al. | |
| 2006/0019486 A1 | 1/2006 | Yu et al. | |
| 2006/0091559 A1 | 5/2006 | Nguyen et al. | |
| 2006/0154086 A1 | 7/2006 | Fuller et al. | |
| 2006/0154477 A1 | 7/2006 | Geng et al. | |
| 2006/0197881 A1 | 9/2006 | Kang et al. | |
| 2006/0205223 A1 | 9/2006 | Smayling | |
| 2006/0231524 A1 | 10/2006 | Liu et al. | |
| 2006/0246373 A1 | 11/2006 | Wang | |
| 2007/0032054 A1 | 2/2007 | Ramaswamy et al. | |
| 2007/0048674 A1 | 3/2007 | Wells | |
| 2007/0054500 A1 | 3/2007 | Bencher | |
| 2007/0059913 A1 | 3/2007 | King et al. | |
| 2007/0072112 A1 | 3/2007 | Prokopowicz et al. | |
| 2007/0077780 A1 | 4/2007 | Wang et al. | |
| 2007/0105303 A1 | 5/2007 | Busch et al. | |
| 2007/0125762 A1 | 6/2007 | Cui et al. | |
| 2007/0128538 A1 | 6/2007 | Fairbairn et al. | |
| 2007/0140029 A1 | 6/2007 | Kim et al. | |
| 2007/0166546 A1 | 7/2007 | Ichikawa et al. | |
| 2007/0166979 A1 | 7/2007 | Wang et al. | |
| 2007/0202640 A1 | 8/2007 | Al-Bayati et al. | |
| 2007/0247073 A1 | 10/2007 | Paterson et al. | |
| 2008/0073636 A1 | 3/2008 | Kim | |
| 2008/0083916 A1 | 4/2008 | Kim | |
| 2008/0128907 A1 | 6/2008 | Yang et al. | |
| 2008/0200003 A1 | 8/2008 | Hong et al. | |
| 2008/0242912 A1 | 10/2008 | Letessier et al. | |
| 2008/0254639 A1 | 10/2008 | Graff | |
| 2008/0254641 A1 | 10/2008 | Kobayashi et al. | |
| 2008/0264803 A1 | 10/2008 | Agrawal | |
| 2009/0176174 A1 | 7/2009 | Chen et al. | |
| 2009/0182180 A1 | 7/2009 | Huang et al. | |
| 2009/0305516 A1 | 12/2009 | Hsu et al. | |
| 2010/0151691 A1 | 6/2010 | Henri et al. | |
| 2010/0297853 A1 | 11/2010 | Hsu et al. | |
| 2011/0244142 A1 | 10/2011 | Cheng et al. | |
| 2012/0149207 A1 | 6/2012 | Graff | |
| 2012/0196446 A1 | 8/2012 | Graff | |
| 2013/0216956 A1 | 8/2013 | Kishioka et al. | |
| 2014/0057454 A1 | 2/2014 | Subramonium et al. | |
| 2014/0199628 A1 | 7/2014 | Edelstein et al. | |
| 2014/0239462 A1 | 8/2014 | Shamma et al. | |
| 2014/0273469 A1 | 9/2014 | Wahl et al. | |
| 2014/0273473 A1 | 9/2014 | Schmid et al. | |
| 2015/0093908 A1 | 4/2015 | Reddy et al. | |

FOREIGN PATENT DOCUMENTS

| | | |
|---|---|---|
| JP | 08-152262 | 6/1996 |
| SU | 382671 | 10/1973 |
| WO | WO 2005/048367 | 5/2005 |

OTHER PUBLICATIONS

"U.S. Appl. No. 14/248,046, filed Apr. 8, 2014, entitled High Selectivity and Low Stress Carbon Hardmask by Pulsed Low Frequency RF Power."

U.S. Appl. No. 13/160,399, filed Jun. 14, 2011, entitled "Methods of Depositing Highly Selective Transparent Ashable Hardmask Films".

U.S. Appl. No. 11/612,382, filed Dec. 18, 2006, entitled "Methods of Improving Ashable Hardmask Adhesion to Metal layers".

U.S. Appl. No. 11/849,208, filed Aug. 31, 2007, entitled "Methods and Apparatus for Plasma-Based Deposition".

(56) References Cited

OTHER PUBLICATIONS

U.S. Appl. No. 13/856,364, filed Apr. 3, 2013, entitled "Methods of Depositing Smooth and Conformal Ashable Hard Mask Films".
US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.
US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Final Office Action, dated Jul. 9, 2008, issued in U.S. Appl. No. 11/449,983.
US Office Action, dated Jan. 5, 2009, issued in U.S. Appl. No. 11/449,983.
US Final Office Action, dated Sep. 15, 2009, issued in U.S. Appl. No. 11/449,983.
US Office Action, dated Jun. 21, 2010, issued in U.S. Appl. No. 11/449,983.
US Final Office Action, dated Dec. 30, 2010, issued in U.S. Appl. No. 11/449,983.
US Notice of Allowance, dated Mar. 16, 2011, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Final Office Action dated Apr. 15, 2010, issued in U.S. Appl. No. 11/710,652.
US Office Action dated Aug. 5, 2010, issued in U.S. Appl. No. 11/710,652.
US Notice of Allowance dated Nov. 24, 2010, issued in U.S. Appl. No. 11/710,652.
US Office Action dated Jul. 9, 2013, issued in U.S. Appl. No. 13/032,392.
US Notice of Allowance dated Oct. 25, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Feb. 28, 2014, issued in U.S. Appl. No. 13/974,808.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance, dated Nov. 2, 2010, issued in U.S. Appl. No. 12/334,220.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.
US Office Action, dated Jun. 1, 2007, issued in U.S. Appl. No. 11/263,148.
US Final Office Action, dated Oct. 24, 2007, issued in U.S. Appl. No. 11/263,148.
US Notice of Allowance, dated Mar. 18, 2008, issued in U.S. Appl. No. 11/263,148.
US Office Action, dated May 2, 2011, issued in U.S. Appl. No. 11/263,148.
US Notice of Allowance, dated Oct. 13, 2011, issued in U.S. Appl. No. 11/263,148.
US Office Action, dated Feb. 15, 2013, issued in U.S. Appl. No. 13/371,184.
US Notice of Allowance, dated Jul. 1, 2013, issued in U.S. Appl. No. 13/371,184.
US Office Action, dated Oct. 9, 2013, issued in U.S. Appl. No. 13/372,363.
US Notice of Allowance, dated Dec. 30, 2013, issued in U.S. Appl. No. 13/372,363.
Korean Office Action, dated Jun. 1, 2010, issued in Application No. 2009/0048358.
Callegari et al. (1993) "Optical properties of hydrogenated amorphous-carbon film for attenuated phase-shift mask applications," J. Vac. Sci. Technol. B 11(6):2697-2699.
Grill, A. (1999) "Diamond-like carbon: state of the art," Diamond and Related Materials 8,pp. 428-434.
Grill, A. (1999) "Plasma-deposited diamondlike carbon and related materials," IBM Journal of Research and Development, vol. 43, ½, http://research.ibm.com/journal/rd/431/grill.html.,14 pp.
Grill, et al. (1990) "Diamondlike carbon films by rf plasma-assisted chemical vapor deposition from acetylene," IBM J. Res. Develop., 34(6):849-857.

(56) References Cited

OTHER PUBLICATIONS

Holmes et al. (1987) "Trimethylsilylacetylene", Organic Syntheses, Coll. vol. 8, p. 606; vol. 65, p. 61.

Ikeda et al. (1992) "Top-PECVD": A New Conformal Plasma Enhanced CVD Technology using TEOS, Ozone and Pulse-modulated RF Plasma, IEEE, pp. 11.2.1-11.2.4.

Jacobsohn et al. (1998) "Hydrogenated Carbon-Nitrogen Films Obtained by PECVD Using Acetylyne and Nitrogen As Precursor Gases," Mat. Res. Soc. Symp. Proc., 498: 283-288.

Kragler et al. (1995) "Scanning tunneling microscopy based lithography employing amorphous hydrogenated carbon as a high resolution resist mask," Appl. Phys. Lett. 67(8):1163-1165.

Kreupl, Franz et al. (2008) "Carbon-Based Resistive Memory," presented at IEDM, submitted Jun. 26, 2008; accepted Aug. 4, 2008, 4 pages.

Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. Mat. Res. Soc. Symp. Proc., 172:85-96 © 1990 Materials Research Society.

Muhl et al. (1999) "A Review of the Preparation of Carbon Nitride Films," Diamond and Related Materials, 8: 1809-1830.

Ong, Soon-Eng et al. (2007) "Temperature effect on bonding structures of amorphous carbon containing more than 30at.% silicon," Diamond & Related Materials, 16:1823-1827.

van de Ven et al. (1990) "Advantages of Dual Frequency PECVD for Deposition of ILD and Passivation Films," VLSI Multilevel Interconnection Conference Proceedings, Seventh International IEEE, 194-201.

Voronkin et al. (1994) "Structure and mechanical properties of a-C:H films deposited onto polymer substrates: Diamond and Related Materials," 4:5-9.

US Office Action, dated Aug. 6, 2015, issued in U.S. Appl. No. 14/185,757.

US Final Office Action, dated Aug. 4, 2014, issued in U.S. Appl. No. 13/974,808.

US Notice of Allowance, dated Oct. 23, 2014, issued in U.S. Appl. No. 13/974,808.

Taiwan Office Action, dated May 8, 2014, issued in TW Application No. 098142631.

\* cited by examiner

SULFUR DOPED CARBON HARD MASKS

CROSS REFERENCE TO RELATED APPLICATION

This application claims the benefit of U.S. Provisional Patent Application No. 61/884,800 filed on Sep. 30, 2013, and titled "SULFUR DOPED CARBON HARD MASKS," which is herein incorporated by reference in its entirety and for all purposes.

BACKGROUND

Amorphous carbon films may be used as hard masks and etch stop layers in semiconductor processing, including in memory and logic device fabrication. These films are also known as ashable hard masks (AHMs) because they may be removed by an ashing technique. As aspect ratios in lithography increase, AHMs require higher etch selectivity. Current methods of forming highly selective AHMs using plasma enhanced chemical vapor deposition (PECVD) processes result in AHMs with high stress, limiting the AHMs' usefulness as hard masks. Accordingly, it is desirable to produce AHMs having high etch selectivity, but low stress.

SUMMARY

Provided are novel methods of depositing ashable hard masks (AHMs) that increase etch selectivity for use in semiconductor processing, including memory and logic device fabrication. In various embodiments, the methods involve providing a precursor gas from a carbon source and a sulfur source to a first layer to be etched on a semiconductor substrate, and generating a plasma from the precursor gas to deposit a sulfur-doped AHM on the first layer by plasma enhanced chemical vapor deposition (PECVD). Examples of layers on which an AHM may be deposited include dielectric layers such as oxides and nitrides, and polysilicon layers. Examples of carbon sources include methane ($CH_4$), acetylene ($C_2H_2$), and propylene ($C_3H_6$). Examples of sulfur sources include hydrogen sulfide ($H_2S$) and carbon disulfide ($CS_2$). In various embodiments, the carbon source and sulfur source may be combined upstream from the deposition chamber, or provided separately to the deposition chamber. In certain embodiments, the sulfur-doped AHMs may have an atomic sulfur content of between about 0.5% and about 5%. In certain embodiments, the sulfur-doped AHMs may have an atomic carbon content of between about 60% and about 90%. In certain embodiments, the sulfur-doped AHMs may have an atomic hydrogen content of between about 13% and about 26%. In some embodiments, the sulfur-doped AHMs may be patterned. The first layer may then be etched in accordance with a patterned AHM. In some embodiments, the sulfur-doped AHMs may be between about 1000 Å and about 90,000 Å thick. In various embodiments, the sulfur-doped AHMs have stress between about −40 MPa and about −400 MPa.

Another aspect relates to a method of forming a sulfur-doped carbon-based film on a semiconductor substrate. A semiconductor substrate may be provided in a deposition chamber. In various embodiments, the semiconductor substrate is exposed to a precursor gas including a carbon source and sulfur source in the deposition chamber and a sulfur-doped carbon-based film is deposited on the substrate by PECVD. In certain embodiments, the sulfur-doped carbon-based film may have an atomic sulfur content of between about 0.5% and about 5%. In certain embodiments, the sulfur-doped carbon-based film may have an atomic sulfur content of between about 0.5% and about 3.5%. In various embodiments, the sulfur source may be hydrogen sulfide or carbon disulfide.

Another aspect relates to an apparatus configured to process a semiconductor substrate. According to various embodiments, the apparatus includes a deposition chamber including a showerhead, a plasma generator configured to apply power to the deposition chamber, a substrate support, and one or more gas inlets, and a controller configured to control the operations in the apparatus and including machine-readable instructions for flowing a precursor gas including a carbon source and a sulfur source to the deposition chamber housing the substrate and applying power to the plasma generator to generate plasma from the precursor gas to deposit a sulfur-doped ashable hard mask on the substrate by PECVD.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor processing, masking methods may be used to pattern and etch substrates. As substrate aspect ratios increase, the demand for highly selective hard masks increases. Masks that have high etch selectivity and yet are easy to remove without damage to the substrate are important to processing substrates.

Ashable hard masks (AHMs) can be used as masks in etch stop layers, or during selective etching, or where a photoresist may not be thick enough to mask the underlying layer. AHMs may also be used on glass substrates for display and other technologies.

AHMs have a chemical composition that allows them to be removed by a technique referred to as ashing, and alternately referred to as plasma ashing or dry stripping, once they have served their purpose. Substrates with hard masks to be ashed are placed into a chamber under vacuum, and monatomic oxygen from a plasma reacts with the hard mask to oxidize it to water, carbon monoxide, and carbon dioxide. The plasma can be formed either in the chamber or remotely by subjecting oxygen to radio frequency power. In some instances, complete removal of the hard mask may be accomplished by following the ashing with additional wet or dry etching processes, for example when the ashable hard mask leaves behind any residue that cannot be removed by ashing alone.

An AHM may be generally composed of carbon and hydrogen and optionally, a trace amount of one or more dopants (e.g., nitrogen, fluorine, boron, and silicon). The bonding structure of an AHM may be $sp^2$ (graphite-like) or $sp^3$ (diamond-like), or a combination of both, depending on the deposition conditions.

Figure 1:
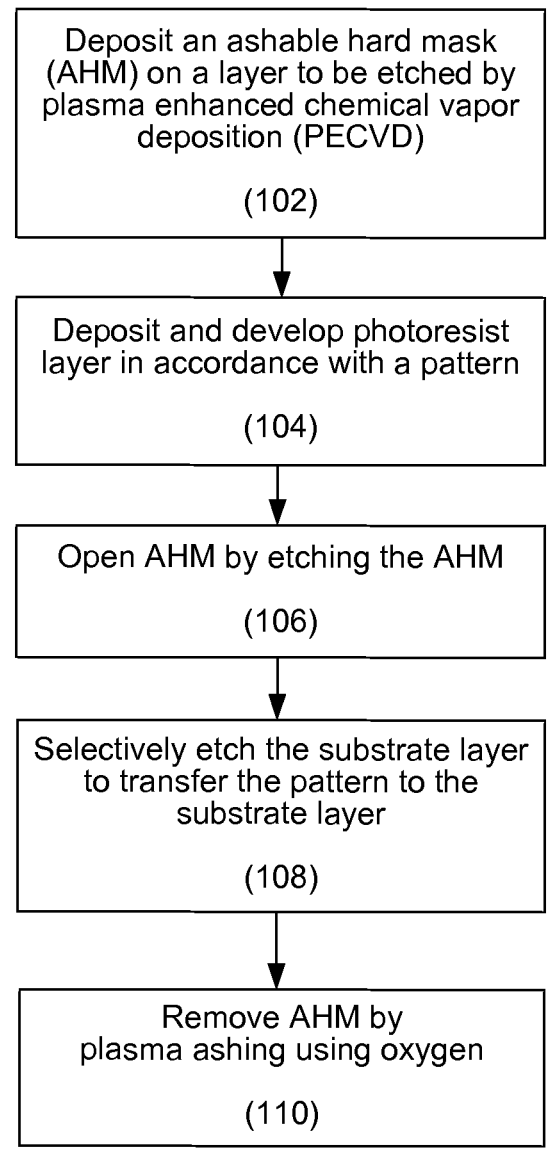
FIG. 1 is a process flow diagram showing relevant operations of methods of using ashable hard masks in etching operations according to various embodiments.

FIG. 1 is a process flow diagram showing relevant operations of methods of using an AHM as a hard mask in etching operations. Prior to AHM deposition, a substrate having a layer to be etched can be provided in a deposition chamber. While the description below refers to semiconductor substrates, the methods may be applied to layers on other types of substrates such as glass substrates. Examples of materials that may be masked with an AHM include dielectric materials such as oxides (e.g., $SiO_2$) and nitrides (e.g., SiN and TiN), polysilicon (Poly-Si), and metals such as aluminum (Al), copper (Cu), and tungsten (W). In certain embodiments, the AHMs described herein may be used to pattern oxides, nitrides, or polysilicon layers.

In operation 102, an AHM is deposited on the layer to be etched by plasma enhanced chemical vapor deposition (PECVD), which may involve generating plasma in the deposition chamber. Single radio frequency (RF) plasma sources or dual RF plasma sources that include a high frequency (HF) component and a low frequency (LF) component may be used. In some processes, one or more AHM layers may be deposited.

In operation 104, a photoresist layer is deposited, exposed, and developed in accordance with a desired etch pattern. In some implementations, an anti-reflective layer (ARL) may be deposited on the AHM prior to photoresist deposition.

In operation 106, the AHM is opened by etching the exposed portions of the AHM. Opening the AHM may be performed by an oxygen-based dry etch as described below with reference to operation 110.

Next, in operation 108, the substrate layer is selectively etched to transfer the pattern to the substrate layer. The selective etch may be performed such that the substrate layer is etched without substantially diminishing the AHM walls. Examples of etches can include radical- and/or ionic-based etches. Examples of etch chemistries can include halogen-based etch chemistries such as fluorine-containing and chlorine-containing etch chemistries. For example, capacitively-coupled plasmas generated from fluorocarbon-containing process gases may be used to selectively etch oxide layers. Specific examples of process gases include $C_xF_y$-containing process gases, optionally with oxygen ($O_2$) and an inert gas, such as $C_4H_8/CH_2F_2/O_2/Ar$. The etch process may use a direct (in-situ) or remote plasma according to various embodiments.

Lastly, in operation 110, the AHM may be removed by ashing, plasma ashing, or dry stripping. Oxygen ($O_2$) may be introduced in a chamber under vacuum such that the plasma reacts with the AHM and oxidizes it to water ($H_2O$), carbon monoxide (CO), and carbon dioxide ($CO_2$). If a dopant is used, the plasma may react with and oxidize the doped AHM. Optionally, any remaining AHM residue may also be removed by wet or dry etching processes after ashing. The result is the desired patterned substrate layer.

High aspect ratio patterning may use AHMs having high etch selectivity. Etch selectivity can be determined by comparing the etch rate of the AHM layer to an underlying layer. If an AHM has lower hydrogen content, its durability may be strengthened and etch selectivity may increase. If the AHM etch rate decreases, then the etch selectivity may increase. AHMs having low hydrogen content and lower etch rate may yield high etch selectivity.

To date, known, highly selective AHMs have high hydrogen content, thereby limiting effective AHM use. Current methods form carbon-based AHMs by introducing a carbon-based precursor gas, such as a hydrocarbon, by PECVD. However, continuous ion bombardment also incorporates excessive unbound hydrogen atoms in the AHM and causes high ion bombardment of heavy atomic weight ions. This increases the stress of the deposited AHM, which limits AHM applications because a high stress AHM is more likely to collapse or compress. Increased stress levels also make alignment more difficult. Dopants, such as silicon, boron, germanium and nitrogen, may be used to decrease AHM hydrogen content to increase etch selectivity. However, higher aspect ratio lithography often needs AHMs with higher etch selectivity than even current doped AHMs provide.

According to various embodiments, provided herein are methods of forming AHMs with higher selectivity. These methods yield sulfur-doped AHMs with low hydrogen content that retard the etch rate, and are easy to remove, resulting in highly selective hard masks for effective semiconductor processing.

Figure 2:
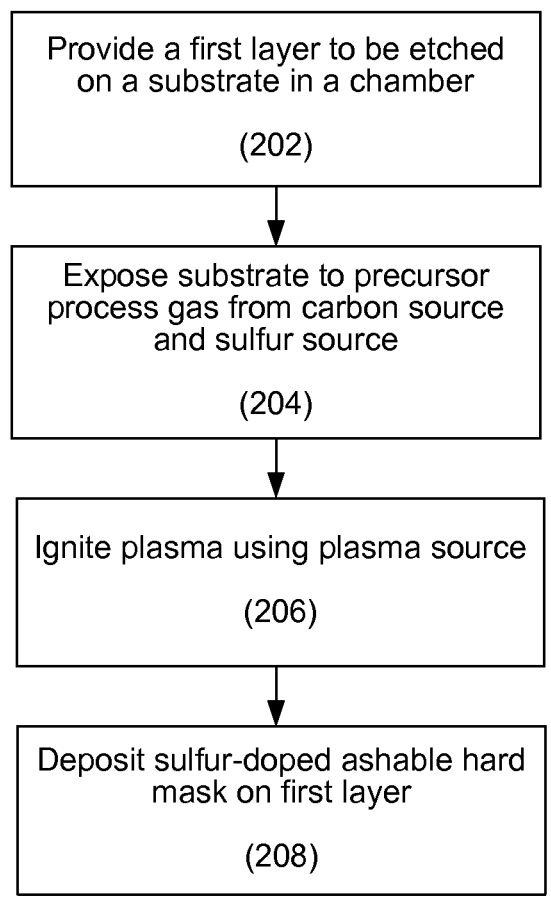
FIG. 2 is a process flow diagram showing relevant operations of methods of forming sulfur-doped ashable hard masks according to various embodiments.

FIG. 2 shows a process flow diagram showing relevant operations of methods of forming sulfur-doped AHMs according to various embodiments. First, in operation 202, a first layer to be etched on a substrate is provided in a chamber. Examples of substrates and substrate layers are described above with reference to operation 102 in FIG. 1. In FIG. 1, an integration method using an AHM as a hard mask is described. In some other embodiments, the AHMs described herein may also be used as etch stop layers in addition to or instead of as hard masks.

Then, in operation 204, the first layer is exposed to a precursor gas including a carbon source and a sulfur source. In various embodiments, the carbon source may be a hydrocarbon precursor defined by the formula $C_xH_y$, where X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In some embodiments, two or more hydrocarbon precursors may be introduced.

In various embodiments, the sulfur source may be hydrogen sulfide ($H_2S$), carbon disulfide ($CS_2$), sulfur dioxide ($SO_2$), sulfur hexafluoride ($SF_6$) or carbonyl sulfide (COS). Other sulfur sources include methane-thiol, ethane thiol, and ethane dithiol. The sulfur source and carbon source may be premixed. In some embodiments, the sulfur source and carbon source may be provided separately to the chamber.

In addition to hydrocarbon and sulfur-based precursors, a carrier gas may be used to dilute the precursor gas flow. The carrier gas may be any suitable carrier gas, including helium (He), argon (Ar), nitrogen ($N_2$), hydrogen ($H_2$), or a combination of any of these.

Total pressure in the deposition chamber may range from between about 1 Torr and about 20 Torr, or about 1.8 Torr. In some embodiments, pressure may be between about 1 Torr and about 10 Torr. In some embodiments, the hydrocarbon precursor may be introduced at a low partial pressure, e.g., between about 0.01 Torr and about 4 Torr, as discussed in U.S. Pat. Nos. 7,981,777 and 7,981,810, which are incorporated herein by reference. In certain embodiments, the partial pressure may be at or below about 0.2 Torr.

Precursor gas flow rates depend on the particular deposition chamber and substrate. Examples of flow rates used for 300 mm substrates are between about 200 sccm and about 4,000 sccm of acetylene, between about 1,000 sccm and about 20,000 sccm of hydrogen, and between about 0 sccm and about 20,000 sccm of helium. In some embodiments, the flow rate of nitrogen may be between about 0 sccm and about 3,000 sccm. Examples of flow rates of the sulfur source may be between about 50 sccm and about 400 sccm of carbon disulfide. Optionally, precursor gases may be flowed continuously or pulsed. The carbon source and sulfur source may be pulsed in synchrony or out of synchrony. The pulse frequency of the sulfur source may be between about 0.05 Hz and about 1 Hz. The pulse frequency of the carbon source may be between about 0.05 Hz and about 1 Hz.

The methods described herein may be used with any appropriate process temperature to obtain desired AHM characteristics, with examples ranging from about 50° C. to about 550° C. Process temperature can affect the selectivity and transparency at least in part due to $sp^2$ bond versus $sp^3$ bond formation. Higher temperatures favor $sp^2$ rich amorphous carbon network formation as the high temperatures enable easy breakage of C—H bonds and subsequent diffusion of hydrogen. For example, films deposited at temperatures above about 500° C. may have significantly more $sp^2$ CH and $CH_2$ bonds compared to $sp^3$ bonds, with increased carbon content and higher density, which correlate with increased etch selectivity. However, these films may not be suitable for thick hard mask applications due to the lower optical bandgap of $sp^2$ carbon. For example, at 2 kÅ and above, the films may not be transparent enough for mask alignment. U.S. Pat. No. 7,981,810, referenced above, provides process conditions for deposition of selective and transparent AHMs at lower temperatures and/or dilute hydrocarbon precursor flows. AHMs deposited at lower temperatures, e.g., below about 400° C., may have varying amounts of $sp^2$ bonding compared to AHMs deposited at higher temperatures.

Next, returning to FIG. 2, in operation 206, plasma is ignited using a plasma source. In some embodiments, a single frequency RF plasma source may be used to generate capacitively coupled plasma. The frequency of an RF source may be about 13.56 MHz, for example. In various embodiments, the plasma source may be a dual RF plasma source that includes an HF RF component and an LF RF component. In certain embodiments, the methods of the embodiments use LF RF power to generate high energy ion bombardment. Low frequency RF power refers to an RF power having a frequency between 100 kHz and 2 MHz—for example, 430 kHz. During deposition, in some embodiments, the LF power ranges between about 0.001 W/cm$^2$ and about 0.5 W/cm$^2$, or between about 0.14 W/cm$^2$ and about 0.35 W/cm$^2$, where W/cm$^2$ expresses Watts per square centimeter of substrate surface area. High frequency RF power refers to an RF power having a frequency between 2 MHz and 60 MHz, such as a frequency of about 13.56 MHz. During deposition, in some embodiments, the HF power ranges between about 0.001 W/cm$^2$ and about 0.2 W/cm$^2$, or about 0.14 W/cm$^2$.

Optionally, RF power may be pulsed at a frequency of between about 2 Hz and about 200 Hz. At least four variations of pulsing or continuous RF power or sulfur flow can be used. First, RF power may be continuous while sulfur flow is continuous. Second, RF power may be pulsed while sulfur flow is continuous. Third, RF power may be continuous while sulfur flow is pulsed. Fourth, both RF power and sulfur source flow may be pulsed.

Although FIG. 3 described below depicts and the description refers chiefly to an RF plasma source to generate the capacitively-coupled plasma for PECVD deposition, other types of sources including direct current (DC) and microwave sources may be used.

Next, referring to FIG. 2, in operation 208, a sulfur-doped AHM is deposited on the first layer by PECVD. In certain embodiments, the atomic hydrogen content in the sulfur-doped AHM may be between about 13% and about 26% and the atomic sulfur content may be between about 0.5% and about 5%, or between about 0.5% and about 3.5%, or about 2%. The carbon content of a sulfur-doped AHM may be between about 60% and about 90%. In some embodiments, the first layer is an oxide/polysilicon stack. In some embodiments, the first layer is an oxide/nitride stack. In some embodiments, the sulfur-doped AHM may have a modulus to stress ratio of less than about 1, or between about 0.1 and about 0.7. In some embodiments, the modulus of the sulfur-doped AHM may be between about 30 GPa and about 50 GPa and a stress may be between about −400 MPa to about −50 MPa. For a given stress, the etch rate decreases (etch selectivity increases) with increasing doping.

While the disclosed embodiments are not limited by any particular theory, it is believed that while using a sulfur-based precursor gas may create covalent $sp^2$ bonds susceptible to a higher etch rate due to the lower coordination number (as opposed to $sp^a$ bonds), the structure of $sp^2$ bonds may increase the volume of sulfur and carbon atoms in the network, thereby reinforcing the strength of the AHM and increasing selectivity.

It is also believed that the sulfur source may create a potential ionic force between sulfur and carbon and hydrogen atoms, which creates a more stable, or less stressed solid, or both. However, a sulfur source with hydrogen, such as $H_2S$, may increase the amount of hydrogen ion or radical bombardment during deposition and risk increasing AHM stress.

While the disclosed embodiments are not limited by any particular theory, it is believed that a sulfur-doped AHM acts as a retardant in the etching process, strengthening the AHM's ability to withstand gas flows during etching whereby the etch chemistry interacts with sulfur in the AHM instead of with carbon. Thus, the sulfur-doped AHM reinforces the AHM's masking strength and increases etch selectivity.

Thus, it is believed that the sulfur-doped AHM's increase in etch selectivity may be due to bond formation and structure, covalent bond and ionic force strength between the atoms, and etching retardant properties.

In another embodiment of using AHMs with reference to FIG. 1 above, method 100 may implement deposition of a sulfur-doped carbon-based AHMs or sulfur-doped amorphous carbon films on a first layer in operation 102 before the photoresist layer is deposited and developed in operation 104. After etching the sulfur-doped carbon-based film in operation 106, the first layer is selectively etched in operation 108. Lastly, plasma ashing may be used to remove the sulfur-doped carbon-based film, yielding the desired patterned first layer.

In various embodiments, the dopant used to form a sulfur-doped carbon-based layer may be hydrogen sulfide ($H_2S$) or carbon disulfide ($CS_2$). While the disclosed embodiments are not limited by any particular theory, it is believed that plasma ashing effectively removes the sulfur-doped AHM because sulfur can react well with oxygen-based plasma for removal.

Apparatus

Embodiments can be implemented on a multi-station, or multi-chamber, or single station tool. Various embodiments may be compatible with existing semiconductor processing equipment, such as PECVD reactors—for example, the Sequel™ or Vector™ reactor chambers available from Lam Research Corporation. Generally, the apparatus houses one or more chambers or reactors, each including one or more stations. Chambers suitable for substrate processing may house one or more substrates. The one or more chambers maintain the substrate in a defined position or positions, by preventing rotation, vibration, or other agitation. In some embodiments, a substrate undergoing sulfur-doped AHM deposition may be transferred from one station to another within a chamber during deposition. For example, a 2000 Å sulfur-doped AHM may be deposited entirely at one station, or 500 Å of film may be deposited at each of four stations in accordance with various embodiments. Alternatively, any other fraction of the total film thickness may be deposited at any number of stations. In various embodiments where more than one AHM is deposited, more than one station may be used to deposit each AHM layer. During processing, each substrate is held in place by a pedestal, wafer chuck, and/or other substrate holding apparatus. For certain operations where the substrate is to be heated, the apparatus may have a heater such as a heating plate.

Figure 3:
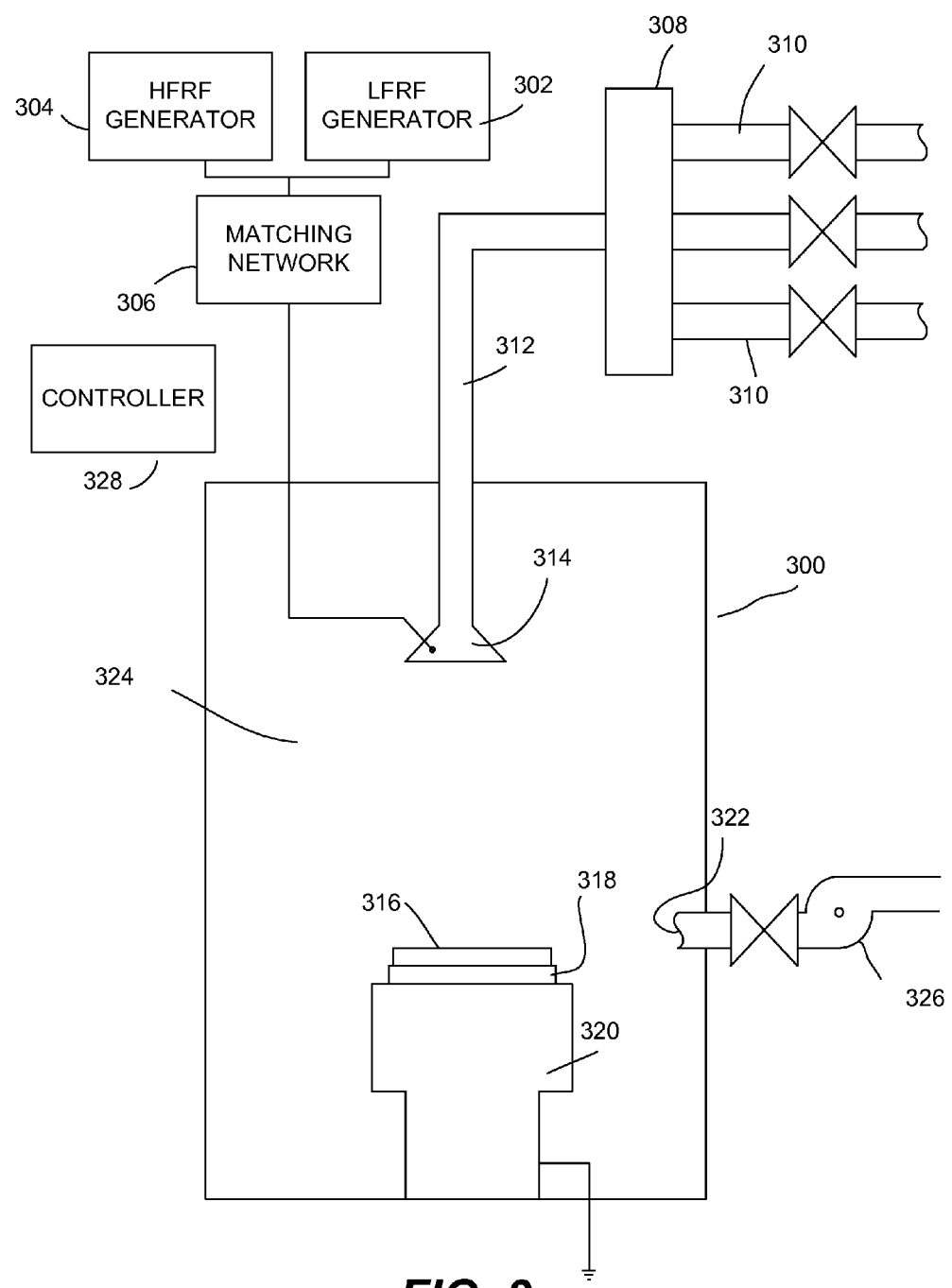
FIG. 3 shows a schematic illustration of an example of a plasma enhanced chemical vapor deposition (PECVD) chamber suitable for practicing various embodiments.

FIG. 3 shows a schematic illustration of an example of a PECVD reactor suitable for practicing various embodiments. As shown, a reactor 300 houses a chamber 324, which may be a station of a multi-station tool, or a chamber of a multi-chamber, multi-station tool. Chamber 324 encloses other reactor components with the plasma generated by a capacitor type system and a showerhead 314 working in conjunction with a grounded heater block 320. An LF RF generator 302 and an HF RF generator 304 may be connected to a matching network 306, which is further connected to showerhead 314. In some embodiments, a single RF generator (not shown) may be used. The power and frequency sufficient to generate plasma from the process gas may be supplied by matching network 306.

Within the reactor, a substrate support 318 holds a substrate 316. The pedestal typically has a chuck, a fork, or lift pins to hold and transfer the substrate during and between the deposition and/or plasma reactions. The chuck may be an electrostatic chuck, a mechanical chuck or various other types of chuck.

The process gases are introduced via inlet 312. Multiple source gas lines 310 are connected to manifold 308. The gases may be optionally premixed. Appropriate valving and mass flow control mechanisms may be employed to ensure that the correct gases are delivered during the process. In case any chemical precursors are delivered in liquid form, liquid flow control mechanisms may be employed. The liquid is then vaporized and mixed with other process gases during its transportation in a manifold heated above its vaporization point before reaching the deposition chamber.

Process gases exit chamber 324 via an outlet 322. A vacuum pump 326 (e.g., a one or two stage mechanical dry pump, or a turbomolecular pump) draws process gases out and maintains a suitably low pressure within the reactor by a close-loop, controlled flow restriction device, such as a throttle valve or a pendulum valve. In various embodiments, the density of the plasma in the chamber may be about $10^{14}$ to about $10^{16}$ ions/m$^3$.

Reactor 300 also includes an embodiment of a system controller 328 employed to control process conditions and hardware states of reactor 300. For example, in some embodiments, system controller 328 may control one or more process parameters during a PECVD film deposition phase to achieve a desired sulfur-doped AHM film, such as precursor gas flow from a carbon source and sulfur source, or LF RF power and HF RF power levels.

In some embodiments, a system controller 328 (which may include one or more physical or logical controllers) controls some or all of the operations of a process tool. Instructions for implementing appropriate control operations are executed on the processor. These instructions may be stored on the memory devices associated with the system controller 328 or they may be provided over a network. In certain embodiments, the system controller 328 executes system control software.

For example, a system controller 328 may control the delivery of appropriate gases (e.g., carbon source or sulfur source), the receipt of a substrate from outside the apparatus and/or the transfer a substrate from one station to the next of a multi-station chamber. The system controller 328 may also control the temperature, pressure, LF RF power, HF RF power, etc. during deposition.

System controller 328 may include one or more memory devices, one or more mass storage devices, and one or more processors. A processor may include a CPU or computer, analog and/or digital input/output connections, stepper motor controller boards, etc.

In some embodiments, system controller 328 controls all of the activities of reactor 300. In some embodiments, system controller 328 executes machine-readable system control software stored in mass storage device, loaded into memory device, and executed on processor so that the apparatus will perform a method in accordance with the present embodiments. Alternatively, the control logic may be hard coded in the system controller 328. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

System control software may include instructions for controlling the timing, mixture of gases, flow rate of process gases (e.g., sulfur source, carbon source, etc.), chamber and/or station and/or reactor pressure, chamber and/or station and/or reactor temperature, substrate temperature, target power levels, RF power levels, substrate pedestal, chuck and/or susceptor position, and other parameters of a particular process performed by reactor 300. System control software may be configured in any suitable way. For example, various process tool component subroutines or control objects may be written to control operation of the process tool components for performing various process tool processes. System control software may be coded in any suitable computer readable programming language.

In some embodiments, system control software may include input/output control (IOC) sequencing instructions for controlling the various parameters described above. For example, each phase of a fabrication process may include one or more instructions for execution by system controller 328. The instructions for setting various process conditions for depositing low stress, sulfur-doped AHMs may be included. Examples of relevant process conditions are described herein.

Other computer software and/or programs stored on mass storage device and/or memory device associated with system controller 328 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate support 318 and to control the spacing between the substrate and other parts of reactor 300.

A process gas control program may include code for controlling gas composition and flow rates and optionally for flowing gas into one or more process stations prior to deposition in order to stabilize the pressure in the process station. A process gas control program may also include code for pulsing gas from a sulfur source and/or a carbon source in accordance with embodiments herein. A pressure control program may include code for controlling the pressure in the process station by regulating, for example, a throttle valve in the exhaust system of the process station, a gas flow into the process station, etc.

A heater control program may include code for controlling the current to one or more heating units that are used to heat the substrate and/or processing chamber. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 328. The user interface may include a display screen, graphical software displays of the apparatus and/or process conditions, and user input devices such as pointing devices, keyboards, touch screens, microphones, etc.

In some embodiments, parameters adjusted by system controller 328 may relate to process conditions. Non-limiting examples include process gas composition and flow rates, such as of a carbon source or sulfur source, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 328 from various process tool sensors. The signals for controlling the process may be output on the analog and digital output connections of reactor 300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 328 may provide program instructions for implementing the above-described deposition processes. The program instructions may control a variety of process parameters, such as DC power level, RF bias power level, pressure, temperature, duration of exposure to processing gases and/or heat and/or other energy sources, etc. The instructions may control the parameters to operate in-situ deposition and further processing (e.g., patterning, etching, and activating) of film stacks according to various embodiments described herein.

In some embodiments, the sulfur-doped amorphous carbon films may be formed using a high-density plasma (HDP) method and apparatus. HDP methods generally use inductively-coupled plasma generators located upstream of the reaction space. In some embodiments, the density of plasma in an HDP process may be about $10^{17}$ to about $10^{19}$ ions/m³. In some embodiments, the pressure during deposition by HDP may be between about 1 mTorr to about 200 mTorr.

EXPERIMENTAL

An experiment was conducted to measure the etch rates of sulfur-doped and undoped carbon hardmasks at a given stress level. The experiment was conducted at a process pressure of 1.8 Torr. The following plasma powers are given for a four-station tool on 300 mm substrates.

An undoped carbon hardmask was fabricated by flowing 2500 sccm of acetylene ($C_2H_2$) with a dual radio frequency (RF) plasma at a high frequency (HF) power of 400 W and low frequency (LF) power of 1000 W.

Six sulfur-doped carbon hardmasks were fabricated. First, a 2% sulfur-doped carbon hardmask was fabricated by flowing 2500 sccm of acetylene ($C_2H_2$) and 50 sccm of carbon disulfide ($CS_2$) with a dual RF plasma at a HF power of 400 W and LF power of 1000 W.

The second 2% sulfur-doped carbon hardmask was fabricated by flowing 625 sccm of acetylene ($C_2H_2$), 68 sccm of carbon disulfide ($CS_2$), and 2750 sccm of nitrogen ($N_2$) with a dual RF plasma at a HF power of 400 W and LF power of 1000 W.

The first 5% sulfur-doped carbon hardmask was fabricated by flowing 2500 sccm of acetylene ($C_2H_2$), 262 sccm of carbon disulfide ($CS_2$), 1250 sccm of helium, and 1500 sccm of nitrogen ($N_2$) with a dual RF plasma at a HF power of 400 W and LF power of 1000 W.

The second 5% sulfur-doped carbon hardmask was fabricated by flowing 625 sccm of acetylene ($C_2H_2$), 168 sccm of carbon disulfide ($CS_2$), 1250 sccm of helium, and 1500 sccm of nitrogen ($N_2$) with a dual RF plasma at a HF power of 400 W and LF power of 1000 W.

The third 5% sulfur-doped carbon hardmask was fabricated by flowing 625 sccm of acetylene ($C_2H_2$), 168 sccm of carbon disulfide ($CS_2$), 1250 sccm of helium, and 1500 sccm of nitrogen ($N_2$) with a dual RF plasma at a HF power of 400 W and LF power of 400 W.

The fourth 5% sulfur-doped carbon hardmask was fabricated by flowing 625 sccm of acetylene ($C_2H_2$), 168 sccm of carbon disulfide ($CS_2$), 1250 sccm of helium, and 1500 sccm of nitrogen ($N_2$) with a dual RF plasma at a HF power of 400 W and LF power of 400 W.

The stress and modulus were measured for all seven stacks. The relative etch rates to an oxide/nitride/oxide/nitride (ONON) stack and an oxide/polysilicon/oxide/polysilicon (OPOP) stack were measured for each hardmask. The relative etch rates were normalized to show the comparison in etch rate improvement for doped hardmasks as compared to the undoped hardmask. The results are summarized below in Table 1.

TABLE 1

Stress, Modulus, and Etch Rates of Doped vs. Undoped AHMs

| Film | Stress (MPa) | Modulus (GPa) | Relative Etch Rate to ONON | Relative Etch Rate to OPOP |
|---|---|---|---|---|
| Undoped AHM | 2 | 25 | 1.00 | 1.00 |
| 2% S-doped AHM #1 | −51 | 34 | 0.94 | 0.96 |
| 2% S-doped AHM #2 | −118 | 72 | 0.81 | 0.74 |
| 5% S-doped AHM #1 | −96 | 46 | 0.80 | 0.94 |
| 5% S-doped AHM #2 | −372 | 68 | 0.58 | 0.81 |
| 5% S-doped AHM #3 | −160 | 70 | 0.56 | 0.76 |
| 5% S-doped AHM #4 | −140 | 72 | 0.80 | 0.76 |

Overall, compared to the undoped AHM, the 2% and 5% sulfur-doped AHMs all exhibited a lower etch rate relative to both the ONON stack and the OPOP stack, thereby exhibiting a higher etch selectivity. Comparisons were made for AHMs at a given stress.

A comparison of ONON etch rates was made between the hardmasks that had a stress level in the range between −100 MPa and 0 MPa. The 5% S-doped AHM #1 had a lower etch rate relative to the ONON stack compared to the 2% S-doped AHM #1, which suggests that the AHM with increased doping at 5% had a higher etch selectivity. Likewise, for hardmasks that had a stress level between −200 MPa and −100 MPa, the 5% S-doped AHMs in #3 and #4 showed a lower etch rate relative to the ONON stack compared to the 2%

S-doped AHM #1 and the undoped AHM. The 5% S-doped AHM #2 also exhibited a lower relative etch rate to the ONON stack compared to the 2% S-doped AHMs and the undoped AHM.

A comparison of OPOP etch rates was made between undoped and doped hardmasks. The results of Table 1 show that for OPOP etch, S-doped AHMs (both 2% and 5% variations) had a lower relative etch rate than the undoped AHM.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

The invention claimed is:

1. A method of forming an ashable hard mask on a first layer to be etched on a semiconductor substrate, comprising:
   providing a precursor gas comprising a carbon source and a sulfur source to a deposition chamber housing the semiconductor substrate, and
   generating a plasma from the precursor gas to thereby deposit a sulfur-doped ashable hard mask on the first layer by a plasma enhanced chemical vapor deposition (PECVD) process.

2. The method of claim 1, wherein the deposited sulfur-doped ashable hard mask has an atomic sulfur content of between about 0.5% and about 5%.

3. The method of claim 2, wherein the deposited sulfur-doped ashable hard mask has an atomic carbon content of between about 60% and about 90%.

4. The method of claim 2, wherein the deposited sulfur-doped ashable hard mask has an atomic hydrogen content of between about 13% and about 26%.

5. The method of claim 1, wherein the sulfur-doped ashable hard mask is between about 1000 Å and about 90,000 Å thick.

6. The method of claim 1, wherein the sulfur-doped ashable hard mask has a stress of between about −40 MPa and about −400 MPa.

7. The method of claim 1, wherein the first layer is selected from the group consisting of an oxide layer, a nitride layer, and a polysilicon layer.

8. The method of claim 1, wherein the carbon source is methane, acetylene, or propylene.

9. The method of claim 1, wherein the sulfur source is hydrogen sulfide ($H_2S$) or carbon disulfide ($CS_2$).

10. The method of claim 1, wherein the sulfur source is carbon disulfide ($CS_2$) and the carbon source is acetylene ($C_2H_2$).

11. The method of claim 1, wherein the carbon source and sulfur source are combined upstream from the deposition chamber.

12. The method of claim 1, wherein the carbon source and the sulfur source are provided separately to the deposition chamber.

13. The method of claim 1, further comprising patterning the sulfur-doped ashable hard mask layer.

14. The method of claim 13, further comprising etching the first layer in accordance with the pattern of the sulfur-doped ashable hard mask.

15. A method of forming a sulfur-doped amorphous carbon-based film on a semiconductor substrate, comprising:
   providing the semiconductor substrate in a deposition chamber,
   exposing the semiconductor substrate to a precursor gas comprising a carbon source and a sulfur source, and
   depositing a sulfur-doped amorphous carbon-based film on the semiconductor substrate by a plasma enhanced chemical vapor deposition (PECVD) process.

16. The method of claim 15, wherein the sulfur-doped amorphous carbon-based film has an atomic sulfur content of between about 0.5% and about 5%.

17. The method of claim 15, wherein the sulfur source is hydrogen sulfide ($H_2S$) or carbon disulfide ($CS_2$).

* * * * *